United States Patent [19]
Tonda

[11] Patent Number: 6,026,023
[45] Date of Patent: Feb. 15, 2000

[54] NON-VOLATILE SEMICONDUCTOR MEMORY

[75] Inventor: Yasuhiro Tonda, Kanagawa, Japan

[73] Assignee: NEC Corporation, Tokyo, Japan

[21] Appl. No.: 09/197,372

[22] Filed: Nov. 20, 1998

[30] Foreign Application Priority Data

Nov. 20, 1997 [JP] Japan ..................................... 9-319956

[51] Int. Cl.[7] ............................. G11C 16/04; G11C 16/06
[52] U.S. Cl. .................................. 365/185.2; 365/185.22; 365/185.29
[58] Field of Search ........................... 365/185.2, 185.22, 365/185.29, 185.33, 218

[56] References Cited

U.S. PATENT DOCUMENTS

| | | | |
|---|---|---|---|
| 5,579,262 | 11/1996 | Song | 365/185.33 |
| 5,615,153 | 3/1997 | Yiu et al. | 365/185.22 |
| 5,864,504 | 1/1999 | Tanzawa et al. | 365/185.22 |

FOREIGN PATENT DOCUMENTS

8-339693   12/1996   Japan .
9-147583   6/1997    Japan .

Primary Examiner—Trong Phan
Attorney, Agent, or Firm—Foley, Hoag & Eliot LLP

[57] ABSTRACT

A non-volatile semiconductor memory includes a reference voltage generating circuit including a series circuit formed of a resistor and a diode, and a constant current circuit for supplying a constant current having a temperature dependency different from that of the diode, to the series circuit, so as to generate at one end of the series circuit a reference voltage having a temperature dependency equivalent to that of the threshold voltage of an erased memory cell. An erase verify voltage generating circuit generates on the basis of the reference voltage an erase verify voltage having a temperature dependency equivalent to that of the threshold voltage of the erased memory cell, and a read voltage generating circuit generates on the basis of the reference voltage a read voltage having a temperature dependency equivalent to that of the threshold voltage of the erased memory cell. Thus, a margin enough to realize a high speed reading can be ensured between the read voltage and the erase verify voltage, regardless of a temperature variation.

20 Claims, 4 Drawing Sheets

NON-VOLATILE SEMICONDUCTOR MEMORY

BACKGROUND OF THE INVENTION

1. Field of the Invention

The present invention relates to a non-volatile semiconductor memory, and more specifically to a circuit for generating an erase verify voltage and a read voltage in an erasable non-volatile semiconductor memory.

2. Description of Related Art

Conventionally, in an erasable, writable and readable non-volatile semiconductor memory such as an EPROM, EEPROM and a flash memory, after an erasing or writing is carried out, an erase verifying or a write verifying is carried out in order to ascertain whether or not the erasing or writing has been properly conducted, and thereafter, a reading operation is carried out. For this purpose, it is an ordinary practice to set and generate an erase verify voltage, a write verify voltage and a read voltage to be applied as a gate voltage of a memory cell at an erase verifying time, a write verifying time and a reading time, respectively, so that one of these set voltages is selected to be supplied to a respective word line.

Figure 4:
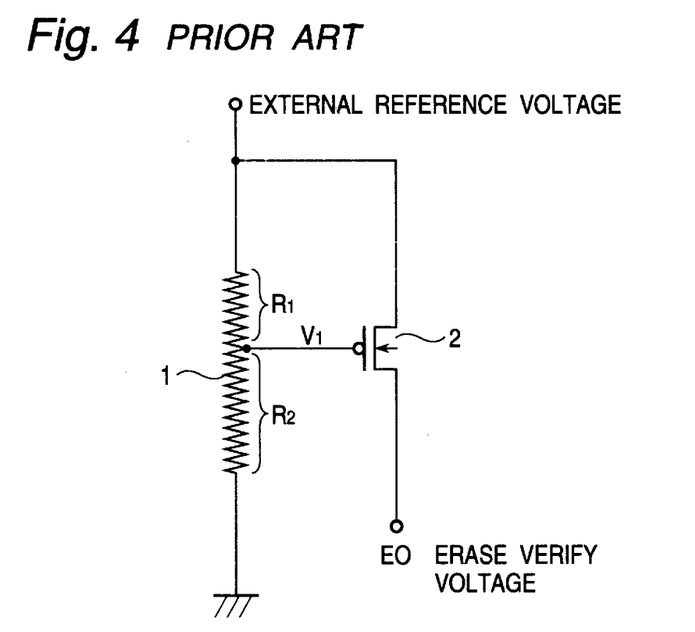
FIG. 4 is a circuit diagram of a portion circuit of generating the erase verify voltage the prior art non-volatile semiconductor memory.

For example, FIG. 4 is a circuit diagram of a circuit portion of generating the erase verify voltage in the prior art non-volatile semiconductor memory. The erase verify voltage generating circuit shown in FIG. 4 receives, as a reference voltage, a sufficiently high, stable external voltage supplied from an external device such as a data writing device used at a memory data writing time. The erase verify voltage generating circuit includes a resistor 1 connected between the externally supplied reference voltage and ground, for outputting a voltage $V_1$ by action of a resistance division of the resistor 1, and an N-channel non-doped transistor 2 having a gate connected to receive the voltage $V_1$, a drain connected to receive the externally supplied reference voltage and a source for outputting the erase verify voltage which is used as the memory cell gate voltage at the erase verifying time.

Namely, assuming that, as shown in FIG. 4, resistance of two resistor components obtained by dividing the resistor 1 are $R_1$ and $R_2$ and the externally supplied reference voltage is Vr, it becomes $$V_1 = \{R_2/(R_1 + R_2)\} \times Vr \quad (1)$$

Since the N-channel non-doped transistor 2 has a threshold voltage which is ordinarily 0V, the erase verify voltage EO at the erase verifying time becomes the same as $V_1$. At this time, since a temperature-depending variation of the resistance of the dividing resistors $R_1$ and $R_2$ of the resistor 1 is the same, the erase verify voltage EO has almost zero temperature-depending variation attributable to an internal circuit of the erase verify voltage generating circuit, and therefore, has only a temperature dependency equal to that of the externally supplied reference voltage. However, the externally supplied reference voltage itself does not have a temperature dependency.

A circuit for generating a read voltage RO which is used as a gate voltage of the memory cell at a reading time, has fundamentally the same circuit construction as that of the erase verify voltage generating circuit as mentioned above, although the generated read voltage RO is different in magnitude from the erase verify voltage EO.

Figure 5:
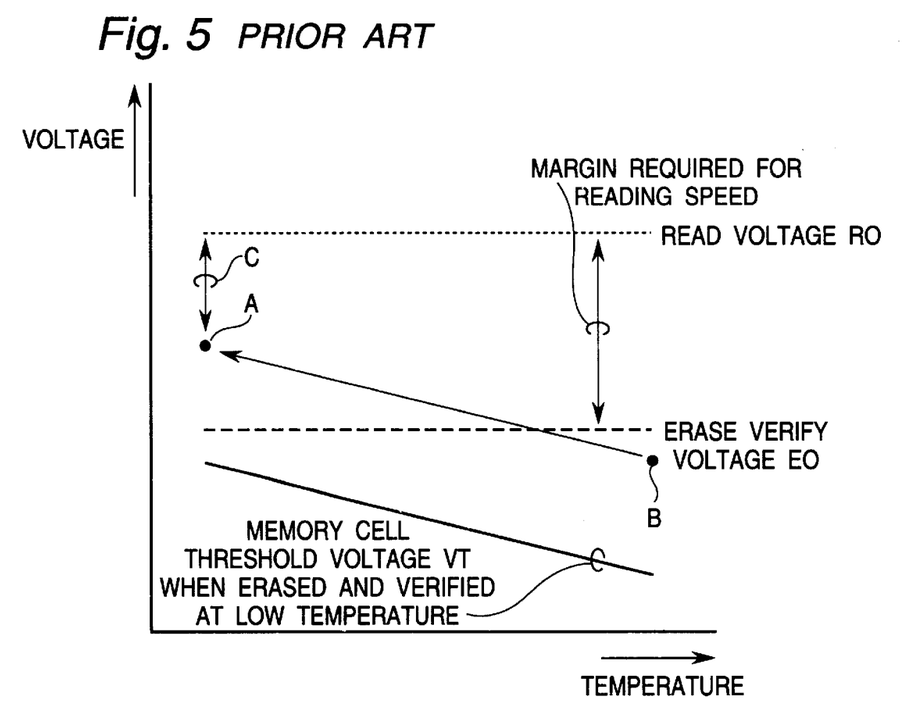
FIG. 5 is a characteristic diagram illustrating the erase verify voltage, the read voltage and the temperature dependency of the threshold voltage of the erased memory cell in this prior art non-volatile semiconductor memory.

Referring to FIG. 5, there is shown a characteristic diagram illustrating the erase verify voltage EO, the read voltage RO and the temperature dependency of the threshold voltage VT of the memory cell in this prior art non-volatile semiconductor memory. Now, a method for setting the erase verify voltage EO and the read voltage RO will be described with reference to FIG. 5.

In general, the erase verify voltage EO and the read voltage RO are determined on the basis of a reading speed at the reading time and a maximum value of the threshold voltage of the erased memory cell. In brief, when the memory cell is in an erased condition, the threshold voltage VT of the memory cell ordinarily scatteringly lies in the range of for example 2V to 0.5V. Therefore, the erase verify voltage EO is set to be slightly higher than the maximum value of the threshold voltage range of the erased memory cell. In particular, since the threshold voltage of the memory cell has a negative temperature dependency, the erase verify voltage EO is set to be slightly higher than the maximum value of the threshold voltage of the memory cell erased at a low temperature.

On the other hand, in order to realize a satisfactory reading speed at the reading time, it is necessary to set the read voltage RO so as to fulfill the following relation:

$$EO \ll RO \quad (2)$$

At this time, since the erase verify voltage EO and the read voltage RO are determined by the ratio of the dividing resistors having the same temperature-depending variation, and since the externally supplied reference voltage itself does not have a temperature dependency, the erase verify voltage EO and the read voltage RO have no temperature-depending variation, as shown in FIG. 5. On the other hand, the threshold voltage VT of the memory cell has the temperature dependency.

In particular, with recent microminiaturization of the semiconductor device, the size of the memory cell itself becomes small. In addition, with a low power supply voltage inclination, a margin required for the reading speed also becomes small, with the result that it becomes difficult to ensure the necessary margin sufficient to cover the variation of the threshold voltage VT of the memory cell caused by the temperature variation.

Now, this problem will be described with reference to FIG. 5.

In an actual use of the prior art non-volatile semiconductor memory, when the erasing operation has been verified by executing the erasing and the erase verifying at a high temperature, there has existed the memory cell having the threshold VT which is slightly lower than the erase verify voltage EO, as indicated by the point B in FIG. 5. On the other hand, if the non-volatile semiconductor memory including this memory cell is used at a low temperature, the threshold voltage VT of the memory cell concerned becomes higher than the threshold voltage at the high temperature, so that the threshold voltage VT becomes as indicated by the point A in FIG. 5, for example. If the memory reading operation is executed in this condition, since a difference between the reading voltage RO and the threshold voltage VT is small as indicated by the margin C in FIG. 5, a memory cell current becomes small, with the result that the reading speed becomes slow, and therefore, the standard can no longer be satisfied.

In the prior art in which the microminiaturization had not yet been advanced and the power supply voltage being used was still high, it was possible to ensure a large voltage difference between the erase verify voltage EO and the read voltage RO, and therefore, it was also possible to cause this voltage difference to include the variation component of the memory cell threshold VT caused by the temperature variation. At present, however, since the power supply voltage has become low so that the shifting amount of the memory cell threshold caused by the writing also becomes small, and since the variation in the threshold voltage after the erasing becomes large, the prior art method for setting the erase verify voltage EO and the read voltage RO has become difficult to ensure a large margin required for the satisfactory reading speed, with the result that it has become difficult to obtain a non-volatile semiconductor memory meeting with the standard.

SUMMARY OF THE INVENTION

Accordingly, it is an object of the present invention to provide a non-volatile semiconductor memory which has overcome the above mentioned defect of the conventional one.

Another object of the present invention is to provide a non-volatile semiconductor memory capable of speeding up the reading speed.

The above and other objects of the present invention are achieved in accordance with the present invention by a non-volatile semiconductor memory configured to apply an erase verify voltage and a read voltage as a gate voltage of a memory cell at an erase verifying time and at a reading time, respectively, comprising a first means for generating the erase verify voltage having a temperature dependency equivalent to that of a threshold voltage of the memory cell, and a second means for generating the read voltage having a temperature dependency equivalent to that of the threshold voltage of the memory cell, so that each of the erase verify voltage and the read voltage becomes high at a low temperature and low at a high temperature.

In one embodiment, the non-volatile semiconductor memory claimed further includes a reference voltage generating circuit including a series circuit formed of a resistor and a diode means, and a constant current circuit for supplying a constant current having a temperature dependency different from that of the diode means, to the series circuit, so as to generate at one end of the series circuit a reference voltage having a temperature dependency equivalent to that of the threshold voltage of the memory cell. The first means and the second means receive the reference voltage for generating the erase verify voltage and the read voltage on the basis of the reference voltage, respectively.

In another embodiment, the non-volatile semiconductor memory claimed further includes a reference voltage generating circuit including a memory cell transistor, and a constant current circuit for supplying a constant current to the memory cell transistor, so as to generate at one end of the memory cell transistor a reference voltage having a temperature dependency equivalent to that of the threshold voltage of the memory cell. The first means and the second means receive the reference voltage for generating the erase verify voltage and the read voltage on the basis of the reference voltage, respectively.

Alternatively, each of the first means and the second means includes a series circuit formed of a resistor and a diode means, and a constant current circuit for supplying a constant current having a temperature dependency different from that of the diode means, to the series circuit, so as to generate at one end of the series circuit a reference voltage having a temperature dependency equivalent to that of the threshold voltage of the memory cell. The first means and the second means generate the erase verify voltage and the read voltage on the basis of the reference voltage, respectively.

Still alternatively, each of the first means and the second means includes a memory cell transistor, and a constant current circuit for supplying a constant current to the memory cell transistor, so as to generate at one end of the memory cell transistor a reference voltage having a temperature dependency equivalent to that of the threshold voltage of the memory cell. The first means and the second means generate the erase verify voltage and the read voltage on the basis of the reference voltage, respectively.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the non-volatile semiconductor memory in accordance with the present invention will be described with reference to the accompanying drawings.

Figure 1:
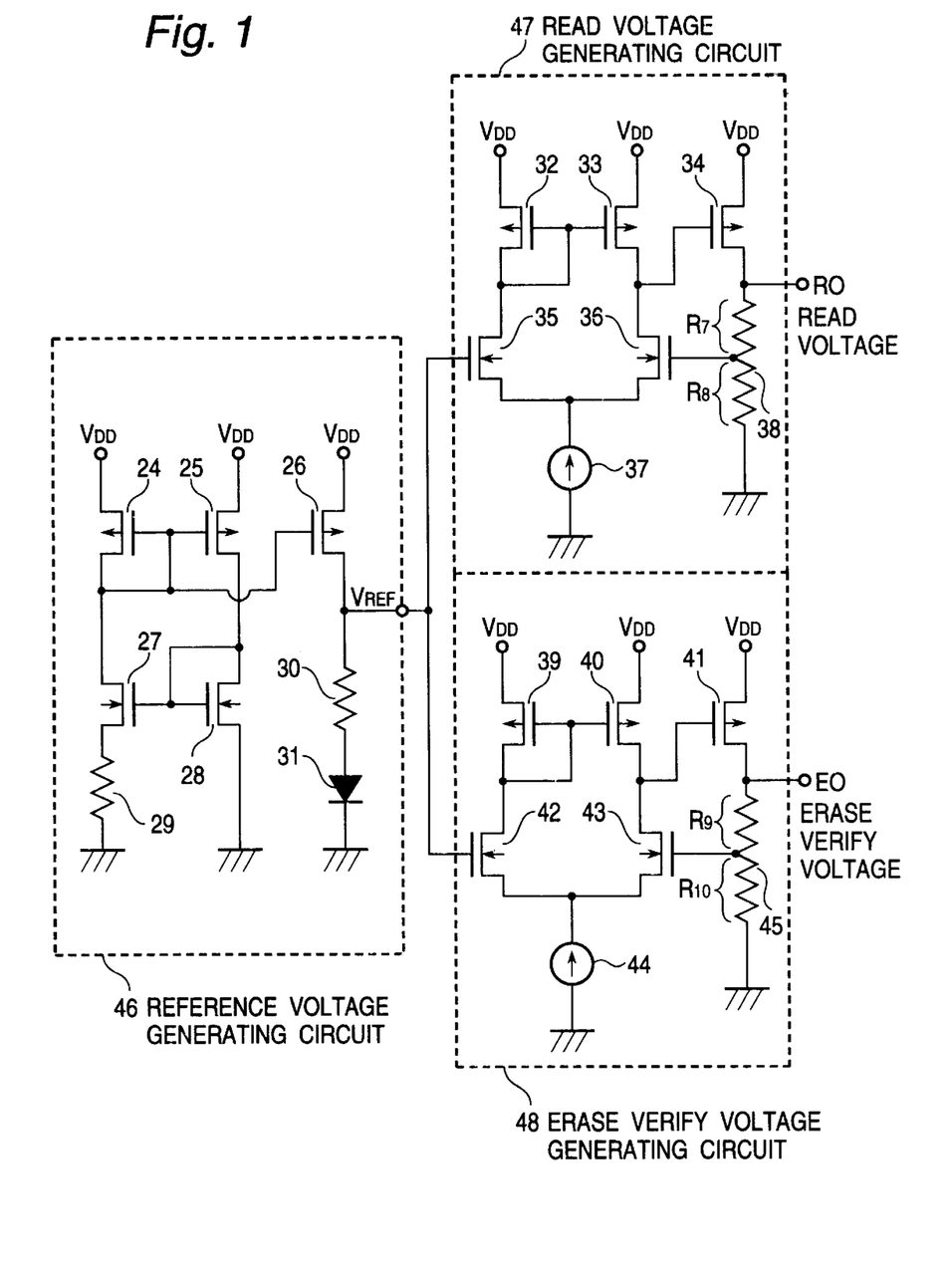
FIG. 1 is a circuit diagram of a portion of a first embodiment of the non-volatile semiconductor memory in accordance with the present invention.

Referring to FIG. 1, there is shown a circuit diagram of a circuit portion for generating the erase verify voltage and the read voltage, in a first embodiment of the non-volatile semiconductor memory in accordance with the present invention.

As shown in FIG. 1, the shown first embodiment of the non-volatile semiconductor memory includes a reference voltage generating circuit 46, an erase verify voltage generating circuit 48 and a read voltage generating circuit 47 for the purpose of generating the erase verify voltage EO and the read voltage RO. As will be seen from the following description, this embodiment is so configured to generate an erase verify voltage EO and a read voltage RO having a temperature dependency equivalent to the temperature dependency of the memory cell threshold voltage so that the erase verify voltage EO and the read voltage RO become high at a low temperature and low at a high temperature.

The reference voltage generating circuit 46 includes a series circuit composed of a cathode-grounded diode 31 and a resistor 30 having one end connected to an anode of the diode 31 and the other end for generating an internal reference voltage $V_{REF}$, and a constant current circuit for supplying this series circuit with a constant current having a temperature dependency different from that of the diode 31.

This constant current circuit includes a resistor 29 having one end connected to ground, an N-channel MOS transistor 27 having a source connected to the other end of the resistor 29, a source-grounded N-channel MOS transistor 28 having a gate and a drain connected in common to a gate of the N-channel MOS transistor 27, a P-channel MOS transistor 24 having a source connected to a power supply voltage $V_{DD}$ and a gate and a drain connected in common to a drain of the N-channel MOS transistor 27, a P-channel MOS transistor 25 having a source connected to the power supply voltage $V_{DD}$, a gate connected to the gate of the P-channel MOS transistor 24 and a drain connected to the drain of the N-channel MOS transistor 28, and a P-channel MOS transistor 26 having a source connected to the power supply voltage $V_{DD}$, a gate connected to the gate of the P-channel MOS transistor 24 and a drain for supplying the above mentioned constant current. With this construction, the constant current circuit supplies the constant current in inverse proportion to the resistance of the resistor 29.

The erase verify voltage generating circuit 48 is a voltage regulator receiving the reference voltage $V_{REF}$ from the reference voltage generating circuit 46 for generating the erase verify voltage EO on the basis of the reference voltage $V_{REF}$. The erase verify voltage generating circuit 48 includes a resistor 45 for voltage-dividing the erase verify voltage EO, and a differential amplifier receiving a divided voltage from the resistor 45 and the reference voltage $V_{REF}$ for the purpose of outputting the erase verify voltage EO on the basis of the reference voltage $V_{REF}$.

Specifically, one end of the resistor 45 is connected to the ground, and the other end of the resistor outputs the erase verify voltage EO. The differential amplifier includes an N-channel MOS transistor 42 having a gate connected to receive the reference voltage $V_{REF}$, an N-channel MOS transistor 43 having a gate connected to an intermediate tap of the resistor 45 and a source connected directly to a source of the N-channel MOS transistor 42, a constant current source 44 having one end connected to the ground and the other end connected to the common-connected sources of the first and second N-channel MOS transistors 42 and 43, a P-channel MOS transistor 39 having a source connected to the power supply voltage $V_{DD}$ and a gate and a drain connected in common to a drain of the N-channel MOS transistor 42, a P-channel MOS transistor 40 having a source connected to the power supply voltage $V_{DD}$, a gate connected to the gate of the P-channel MOS transistor 39 and a drain connected to a drain of the N-channel MOS transistor 43, and a P-channel MOS transistor 42 having a source connected to the power supply voltage $V_{DD}$, a gate connected to the drain of the P-channel MOS transistor 40 and a drain connected to the other end of the resistor 45 for outputting the erase verify voltage EO.

With this arrangement, assuming that the resistance of two divided resistor components of the resistor 45 divided by the intermediate tap of the resistor 45 are $R_9$ and $R_{10}$, the erase verify voltage EO is determined by the resistance $R_9$ and $R_{10}$ as follows:

$$EO=\{(R_9+R_{10})/R_{10}\}\times V_{REF} \qquad (3)$$

The read voltage generating circuit 47 is a voltage regulator receiving the reference voltage $V_{REF}$ from the reference voltage generating circuit 46 for generating the read voltage RO on the basis of the reference voltage $V_{REF}$. This read voltage generating circuit 47 has an internal construction similar to that of the erase verify voltage generating circuit 48, excepting that the generated voltage is different. Therefore, transistors 32 to 36, a constant current source 37 and a resistor 38 correspond to the transistors 39 to 43, the constant current source 44 and the resistor 45 in the erase verify voltage generating circuit 48, respectively, but the resistance ratio of the resistor 38 is different from that of the resistor 45.

Here, assuming that the resistance of two divided resistor components of the resistor 38 divided by the intermediate tap of the resistor 38 are $R_7$ and $R_8$, the erase verify voltage EO is determined by the resistance $R_7$ and $R_8$ as follows:

$$EO=\{(R_7+R_8)/R_8\}\times V_{REF} \qquad (4)$$

In addition, the write verify voltage used as the memory cell gate voltage at a write verifying time can be generated, if necessary, similarly to the erase verify voltage EO and the read voltage RO as mentioned above. Here, however, explanation will be focused on the erase verify voltage EO and the read voltage RO.

Now, an operation of the first embodiment of the non-volatile semiconductor memory will be described.

In the reference voltage generating circuit 46, the constant current supplied to the series circuit composed of the resistor 30 and the diode 31 is in inverse proportion to the resistance of the resistor 29, as mentioned above. Therefore, a voltage drop across the resistor 30 is in proportion to the resistance $R_{30}$ of the resistor 30 itself and in inverse proportion to the resistance $R_{29}$ of the resistor 29. Namely, the voltage drop, which can be set by a resistance ratio between the resistor 30 and the resistor 29 ($R_{30}/R_{29}$), occurs across the resistor 30. A sum of this voltage drop and a forward direction voltage drop of the diode 31 is outputted as the reference voltage $V_{REF}$. Namely, the reference voltage generating circuit 46 is a bandgap type reference voltage generating circuit.

On the other hand, the temperature dependency $\delta(V_{REF})/\delta T$ of the reference voltage $V_{REF}$ is expressed as follows:

$$\frac{\delta}{\delta T}V_{REF} = \frac{k}{q}\times \ln\frac{(W/L)_{25}\times(W/L)_{27}}{(W/L)_{24}\times(W/L)_{28}}\times\frac{(W/L)_{26}}{(W/L)_{24}}\times \\ \frac{R_{30}}{R_{29}}\times\frac{\delta}{\delta T}V_F \qquad (5)$$

where
k is Boltzmann constant
q is elementary charge
$(W/L)_{24}$ is the channel width to length ratio of transistor 24
$(W/L)_{25}$ is the channel width to length ratio of transistor 25
$(W/L)_{26}$ is the channel width to length ratio of transistor 26
$(W/L)_{27}$ is the channel width to length ratio of transistor 27
$(W/L)_{28}$ is the channel width to length ratio of transistor 28
$\delta(V_F)/\delta T$ is the temperature dependency of the forward direction voltage drop of the diode 31.

The temperature dependency $\delta(V_F)/\delta T$ of the forward direction voltage drop of the diode 31 ordinarily has a negative characteristics. In addition, the equation (5) shows that the temperature dependency $\delta(V_{REF})/\delta T$ of the reference voltage $V_{REF}$ can be adjusted by changing the resistance ratio of the resistor 30 to the resistor 29 ($R_{30}/R_{29}$). Therefore, by appropriately setting the resistance ratio of the resistor 30 to the resistor 29 ($R_{30}/R_{29}$), the reference voltage $V_{REF}$ can have a negative temperature dependency equivalent to that of the threshold voltage VT of the memory cell, so that the reference voltage $V_{REF}$ becomes high at a low temperature and low at a high temperature.

On the other hand, the erase verify voltage generating circuit 48 and the read voltage generating circuit 47 respectively generate the erase verify voltage EO and the read voltage RO which are in proportion to the reference voltage $V_{REF}$ as expressed by the equations (4) and (5). Namely, the erase verify voltage EO and the read voltage RO having a negative temperature dependency equivalent to that of the threshold voltage VT of the memory cell, are generated.

Figure 2:
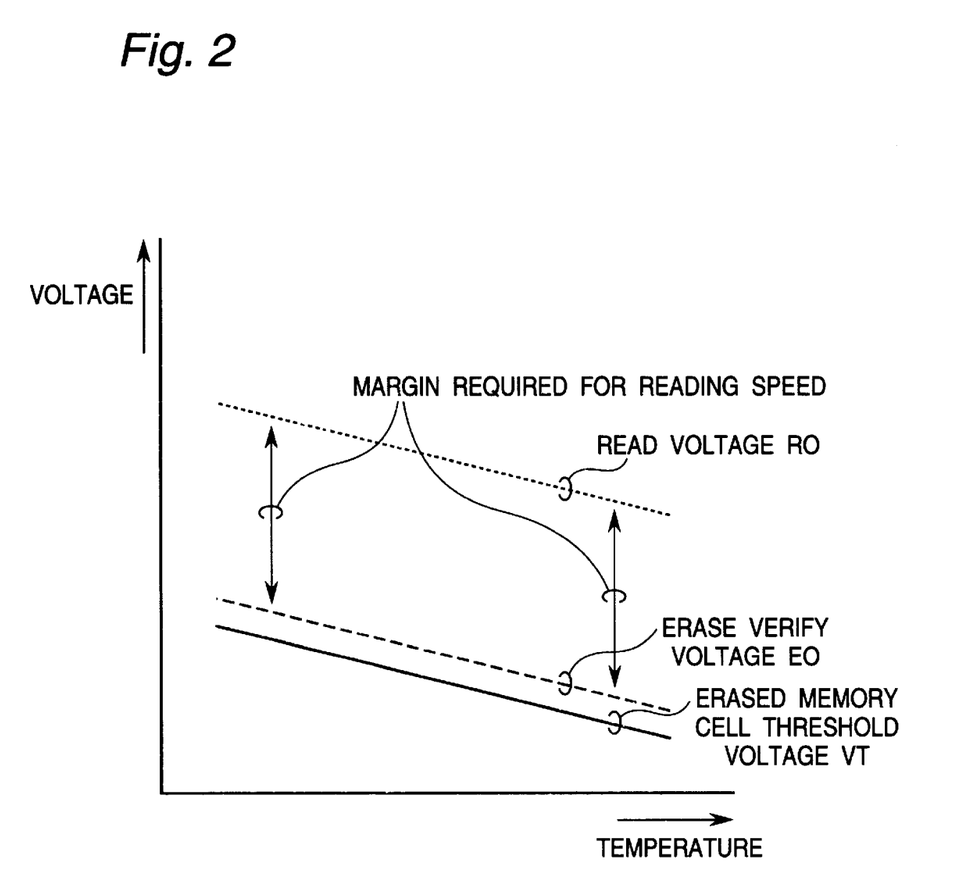
FIG. 2 is a characteristic diagram illustrating the temperature dependency of the erase verify voltage, the read voltage and the threshold voltage of the erased memory cell in the non-volatile semiconductor memory shown in FIG. 1.

Referring to FIG. 2, there is shown a characteristic diagram illustrating the temperature dependency of the erase verify voltage EO, the read voltage RO and the threshold voltage VT of the erased memory cell in the non-volatile semiconductor memory shown in FIG. 1. As shown in FIG. 2, if the temperature elevates, the reference voltage $V_{REF}$ lowers, so that the erase verify voltage EO and the read voltage RO correspondingly lower. On the other hand, when the temperature becomes low, the reference voltage $V_{REF}$ elevates, so that the erase verify voltage EO and the read voltage RO correspondingly elevates. Namely, the erase verify voltage EO, the erase verify voltage EO and the read voltage RO have a negative temperature dependency equivalent to that of the threshold voltage VT of the memory cell, with the result that a difference, namely, margin between the erase verify voltage EO and the read voltage RO, required for a satisfactory reading speed, can be ensured even if the threshold voltage VT of the erased memory cell varies because of the variation in the temperature.

Figure 3:
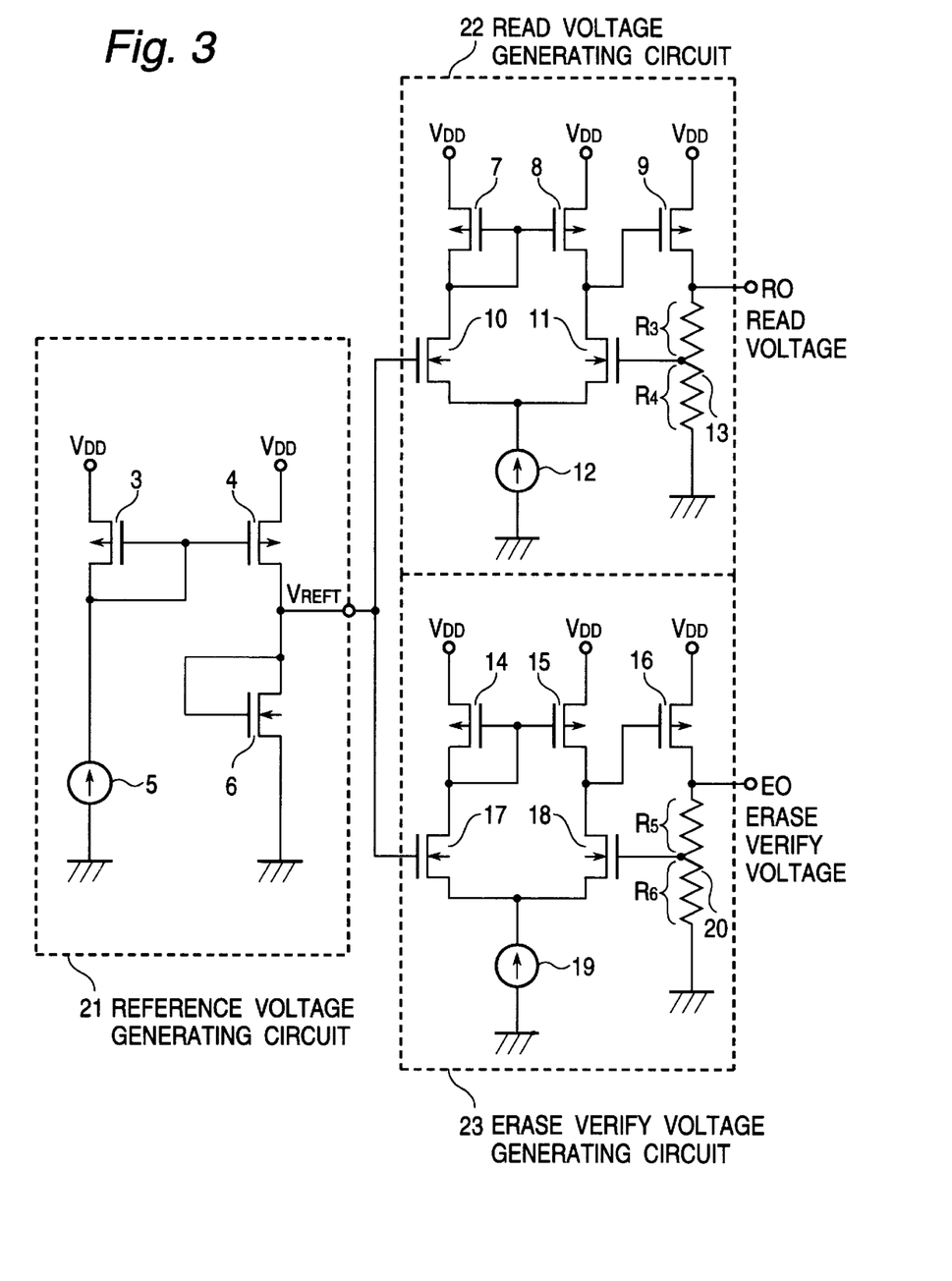
FIG. 3 is a circuit diagram of a portion of a second embodiment of the non-volatile semiconductor memory in accordance with the present invention.

Referring to FIG. 3, there is shown a circuit diagram of a portion of a second embodiment of the non-volatile semiconductor memory in accordance with the present invention.

As shown in FIG. 3, the shown second embodiment of the non-volatile semiconductor memory includes a reference voltage generating circuit 21, an erase verify voltage generating circuit 23 and a read voltage generating circuit 22, for the purpose of generating the erase verify voltage EO and the read voltage RO. Similarly to the first embodiment, this second embodiment is so configured to generate the erase verify voltage EO and the read voltage RO having a temperature dependency equivalent to the temperature dependency of the memory cell threshold so that the erase verify voltage EO and the read voltage RO become high at a low temperature and low at a high temperature.

The erase verify voltage generating circuit 23 and the read voltage generating circuit 22 are similar in construction and in operation to the erase verify voltage generating circuit 48 and a read voltage generating circuit 47, respectively. Therefore, since transistors 7 to 11 and 14 to 18, constant current sources 12 and 19 and resistors 13 and 20 correspond to the transistors 32 to 36 and 39 to 43, the constant current sources 37 and 44 and the resistors 38 and 45, respectively, and since resistance $R_3$, $R_4$, $R_5$ and $R_6$ correspond to the resistance $R_7$, $R_8$, $R_9$ and $R_{10}$, respectively, explanation of the erase verify voltage generating circuit 23 and the read voltage generating circuit 22 will be omitted for simplification of description.

The reference voltage generating circuit 21 includes a source-grounded memory cell transistor 6 having a gate and a drain connected in common for generating a reference voltage $V_{REFT}$, a constant current source 5 having one end connected to ground, a P-channel MOS transistor 3 having a source connected to a power supply voltage $V_{DD}$ and a gate and a drain connected in common to the other end of the constant current source 5, and another P-channel MOS transistor 4 having a source connected to a power supply voltage $V_{DD}$, a gate connected to the gate of the P-channel MOS transistor 3 and a drain connected to the drain of the memory cell transistor 6. Here, the memory cell transistor 6 is for example a transistor which is formed in the same chip as that of the non-volatile semiconductor memory, in the same condition as that for forming memory cells of the non-volatile semiconductor memory, to have the same characteristics as that of the memory cells.

Now, an operation of the reference voltage generating circuit 21 will be described briefly. If a constant current of for example 1 μA is supplied from the transistor 4 of a current mirror circuit formed of the transistors 3 and 4 and controlled by the constant current source 5, the memory cell transistor 6 connected in the form of a diode generates the reference voltage $V_{REFT}$ which is limited to the threshold voltage VT of the memory cell transistor 6. Accordingly, the reference voltage $V_{REFT}$ has a temperature dependency equivalent to the threshold voltage VT of the memory cell transistor 6, and therefore, becomes low if the temperature becomes high.

Thus, similarly to the first embodiment, the erase verify voltage generating circuit 23 and the read voltage generating circuit 22 respectively generate the erase verify voltage EO and the read voltage RO which are in proportion to the reference voltage $V_{REFT}$ as seen from the equations (4) and (5). Namely, the erase verify voltage EO and the read voltage RO having a negative temperature dependency equivalent to that of the threshold voltage VT of the memory cell, are generated. In other words, if the temperature becomes high, the erase verify voltage EO and the read voltage RO become low, and if the temperature becomes low, the erase verify voltage EO and the read voltage RO become high.

In the above mentioned embodiments, the erase verify voltage EO and the read voltage RO are generated on the basis of the reference voltage generated in the reference voltage generating circuit provided separately from the erase verify voltage generating circuit and the read voltage generating circuit. However, as a variation of the present invention, each of the erase verify voltage generating circuit and the read voltage generating circuit can be so constructed to internally and directly generate a target voltage having a temperature dependency equivalent to that of the threshold voltage of the memory cell. In other words, each of the erase verify voltage generating circuit and the read voltage generating circuit can internally include an internal reference voltage generating circuit corresponding to the reference voltage generating circuit 21 or 46.

As mentioned above, the non-volatile semiconductor memory in accordance with the present invention is so constructed that the erase verify voltage and the read voltage are positively caused to vary so as to follow the temperature-depending variation of the memory cell threshold voltage. Therefore, the temperature-depending variation component of the memory cell threshold voltage can be canceled from a difference between the memory cell threshold voltage and the erase verify voltage and from a difference between the memory cell threshold voltage and the read voltage. Accordingly, a difference between the erase verify voltage and the read voltage, namely, a margin required for a satisfactory reading speed, can be sufficiently ensured over the whole of a possible temperature range.

As a result, in an actual use of the non-volatile semiconductor memory, when the erasing and the erase verify are executed for a memory cell at a high temperature so that the threshold of the erased memory cell is verified to confirm the erased condition, even if the reading is executed at a low temperature, a sufficient reading current can be obtained, with the result that a high speed reading can be realized.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory configured to apply an erase verify voltage and a read voltage as a gate voltage of a memory cell at an erase verifying time and at a reading time, respectively, comprising a first means for generating said erase verify voltage having a temperature dependency equivalent to that of a threshold voltage of said memory cell, and a second means for generating said read voltage having a temperature dependency equivalent to that of the threshold voltage of said memory cell.

2. A non-volatile semiconductor memory claimed in claim 1 wherein each of said erase verify voltage and said read voltage is controlled to become high at a low temperature and low at a high temperature.

3. A non-volatile semiconductor memory claimed in claim 1 further including a reference voltage generating circuit including a series circuit formed of a resistor and a diode means, and a constant current circuit for supplying a constant current having a temperature dependency different from that of said diode means, to said series circuit, so as to generate at one end of said series circuit a reference voltage having a temperature dependency equivalent to that of the threshold voltage of said memory cell, and wherein said first means and said second means receive said reference voltage and generate said erase verify voltage and said read voltage on the basis of said reference voltage, respectively.

4. A non-volatile semiconductor memory claimed in claim 3 wherein said diode means of said series circuit includes a diode having a cathode connected to ground and an anode connected to one end of said resistor, said reference voltage being outputted from the other end of said resistor, and wherein said constant current circuit includes a first P-channel transistor having a source connected to a power supply voltage, and a gate and a drain connected to each other, a second P-channel transistor having a source connected to said power supply voltage, and a gate connected to said gate of said first P-channel transistor, a first N-channel transistor having a drain connected to said drain of said first P-channel transistor and a source connected through a second resistor to the ground, a second N-channel transistor having a source connected to the ground and a gate and a drain connected in common to said drain of said second P-channel transistor and a gate of said first N-channel transistor, and a third P-channel transistor having a source connected to said power supply voltage, a gate connected to said gate of said first P-channel transistor and a drain connected to the other end of said first mentioned resistor.

5. A non-volatile semiconductor memory claimed in claim 4 wherein each of said first means and said second means includes a fourth P-channel transistor having a source connected to said power supply voltage, and a gate and a drain connected to each other, a fifth P-channel transistor having a source connected to said power supply voltage, and a gate connected to said gate of said fourth P-channel transistor, a third N-channel transistor having a drain connected to said drain of said fourth P-channel transistor and a gate connected to receive said reference voltage, a fourth N-channel transistor having a drain connected to a drain of said fifth P-channel transistor and a source connected to a source of said third N-channel transistor, a constant current source having one end connected to said sources of said third and fourth N-channel transistors and the other end connected to the ground, a sixth P-channel transistor having a source connected to said power supply voltage, a gate connected to said drain of said fifth P-channel transistor, and a third resistor having one end connected to a drain of said sixth P-channel transistor and the other end connected to the ground, an intermediate tap of said third resistor being connected to a gate of said fourth N-channel transistor, and said erase verify voltage or said read voltage being outputted from said one end of said third resistor.

6. A non-volatile semiconductor memory claimed in claim 1 further including a reference voltage generating circuit including a memory cell transistor, and a constant current circuit for supplying a constant current to said memory cell transistor, so as to generate at one end of said memory cell transistor a reference voltage having a temperature dependency equivalent to that of the threshold voltage of said memory cell, and wherein said first means and said second means receive said reference voltage and generate said erase verify voltage and said read voltage on the basis of said reference voltage, respectively.

7. A non-volatile semiconductor memory claimed in claim 6 wherein said memory cell transistor has a source connected to a ground and a gate and a drain connected to each other in the form of a diode, and said constant current circuit includes a first P-channel transistor having a source connected to a power supply voltage and a gate and a drain connected to each other and connected through a constant current source to the ground, and a second P-channel transistor having a source connected to said power supply voltage, a gate connected to said gate of said first P-channel transistor, and a drain connected to said drain of said memory cell transistor, said reference voltage being outputted from said drain of said memory cell transistor.

8. A non-volatile semiconductor memory claimed in claim 7 wherein each of said first means and said second means includes a third P-channel transistor having a source connected to said power supply voltage, and a gate and a drain connected to each other, a fourth P-channel transistor having a source connected to said power supply voltage, and a gate connected to said gate of said third P-channel transistor, a first N-channel transistor having a drain connected to said drain of said third P-channel transistor and a gate connected to receive said reference voltage, a second N-channel transistor having a drain connected to said drain of said fourth P-channel transistor and a source connected to a source of said first N-channel transistor, a second constant current source having one end connected to said sources of said third and second N-channel transistors and the other end connected to the ground, a fifth P-channel transistor having a source connected to said power supply voltage, a gate connected to said drain of said fourth P-channel transistor, and a third resistor having one end connected to a drain of said fifth P-channel transistor and the other end connected to the ground, an intermediate tap of said third resistor being connected to a gate of said second N-channel transistor, and said erase verify voltage or said read voltage being outputted from said one end of said third resistor.

9. A non-volatile semiconductor memory claimed in claim 1 wherein each of said first means and said second means includes a series circuit formed of a resistor and a diode means, and a constant current circuit for supplying a constant current having a temperature dependency different from that of said diode means, to said series circuit, so as to generate at one end of said series circuit an internal reference voltage having a temperature dependency equivalent to that of the threshold voltage of said memory cell, said first means and said second means respectively generating said erase verify voltage and said read voltage on the basis of said respective internal reference voltage.

10. A non-volatile semiconductor memory claimed in claim 9 wherein said diode means of said series circuit includes a diode having a cathode connected to ground and an anode connected to one end of said resistor, said reference voltage being outputted from the other end of said resistor, and wherein said constant current circuit includes a first P-channel transistor having a source connected to a power supply voltage, and a gate and a drain connected to each other, a second P-channel transistor having a source connected to said power supply voltage, and a gate connected to said gate of said first P-channel transistor, a first N-channel transistor having a drain connected to said drain of said first P-channel transistor and a source connected through a second resistor to the ground, a second N-channel transistor having a source connected to the ground and a gate and a drain connected in common to said drain of said second P-channel transistor and a gate of said first N-channel transistor, and a third P-channel transistor having a source connected to said power supply voltage, a gate connected to said gate of said first P-channel transistor and a drain connected to the other end of said first mentioned resistor.

11. A non-volatile semiconductor memory claimed in claim 10 wherein each of said first means and said second means further includes a fourth P-channel transistor having a source connected to said power supply voltage, and a gate and a drain connected to each other, a fifth P-channel transistor having a source connected to said power supply voltage, and a gate connected to said gate of said fourth P-channel transistor, a third N-channel transistor having a drain connected to a drain of said fourth P-channel transistor and a gate connected to receive said reference voltage, a fourth N-channel transistor having a drain connected to said drain of said fifth P-channel transistor and a source connected to a source of said third N-channel transistor, a constant current source having one end connected to said sources of said third and fourth N-channel transistors and the other end connected to the ground, a sixth P-channel transistor having a source connected to said power supply voltage, a gate connected to said drain of said fifth P-channel transistor, and a third resistor having one end connected to a drain of said sixth P-channel transistor and the other end connected to the ground, an intermediate tap of said third resistor being connected to a gate of said fourth N-channel transistor, and said erase verify voltage or said read voltage being outputted from said one end of said third resistor.

12. A non-volatile semiconductor memory claimed in claim 1 wherein each of said first means and said second means includes a memory cell transistor, and a constant current circuit for supplying a constant current to said memory cell transistor, so as to generate at one end of said memory cell transistor an internal reference voltage having a temperature dependency equivalent to that of the threshold voltage of said memory cell, said first means and said second means respectively generating said erase verify voltage and said read voltage on the basis of said respective internal reference voltage.

13. A non-volatile semiconductor memory claimed in claim 12 wherein said memory cell transistor has a source connected to a ground and a gate and a drain connected to each other in the form of a diode, and said constant current circuit includes a first P-channel transistor having a source connected to a power supply voltage and a gate and a drain connected to each other and connected through a constant current source to the ground, and a second P-channel transistor having a source connected to said power supply voltage, a gate connected to said gate of said first P-channel transistor, and a drain connected to said drain of said memory cell transistor, said reference voltage being outputted from said drain of said memory cell transistor.

14. A non-volatile semiconductor memory claimed in claim 13 wherein each of said first means and said second means further includes a third P-channel transistor having a source connected to said power supply voltage, and a gate and a drain connected to each other, a fourth P-channel transistor having a source connected to said power supply voltage, and a gate connected to said gate of said third P-channel transistor, a first N-channel transistor having a drain connected to said drain of said third P-channel transistor and a gate connected to receive said reference voltage, a second N-channel transistor having a drain connected to said drain of said fourth P-channel transistor and a source connected to a source of said first N-channel transistor, a second constant current source having one end connected to said sources of said third and second N-channel transistors and the other end connected to the ground, a fifth P-channel transistor having a source connected to said power supply voltage, a gate connected to said drain of said fourth P-channel transistor, and a third resistor having one end connected to a drain of said fifth P-channel transistor and the other end connected to the ground, an intermediate tap of said third resistor being connected to a gate of said second N-channel transistor, and said erase verify voltage or said read voltage being outputted from said one end of said third resistor.

15. A semiconductor device, comprising:
 a memory cell;
 a first circuit that provides an erase verify voltage to said memory cell, said erase verify voltage having a negative temperature dependency equivalent to that of a threshold voltage of said memory cell; and
 a second ciruit that provides a read voltage to said memory cell, said read voltage having a negative temperature dependency equivalent to that of the threshold voltage of said memory cell.

16. The non-volatile semiconductor memory of claim 15, wherein each of said erase verify voltage and said read voltage is controlled to become high at a low temperature and low at a high temperature.

17. The non-volatile semiconductor memory of claim 16, further comprising:
 a reference voltage generating circuit having a series circuit formed of a diode and a resistor with one end connected to an anode of said diode and an other end that generates the reference voltage, and a constant current circuit for supplying the series circuit with a constant current having a temperature dependency different from that of the diode, wherein said first and second circuits receive the reference voltage and generate said erase verify voltage and said read voltage on the basis of the reference voltage, respectively.

18. A method of operating a memory cell, comprising:
 generating an erase voltage having a negative temperature dependency with respect to a threshold voltage of the memory cell; and
 generating a read voltage having a negative temperature dependency with respect to that of the threshold voltage of the memory cell.

19. The method of claim 18, wherein each of the erase verify voltage and the read voltage is controlled to become high at a low temperature and low at a high temperature.

20. The method of claim 19 further comprising:

generating the reference voltage using a series circuit formed of a diode and a resistor having one end connected to an anode of the diode and an other end that generates an internal reference voltage, and a constant current circuit for supplying the series circuit with a constant current having a temperature dependency different from that of the diode, wherein the erase verify voltage is generated by a first circuit according to the reference voltage and the read voltage is generated by a second circuit according to the reference voltage.

* * * * *